(12) United States Patent
Shum

(10) Patent No.: US 6,841,824 B2
(45) Date of Patent: Jan. 11, 2005

(54) FLASH MEMORY CELL AND THE METHOD OF MAKING SEPARATE SIDEWALL OXIDATION

(75) Inventor: Danny Shum, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 12 days.

(21) Appl. No.: 10/234,344

(22) Filed: Sep. 4, 2002

(65) Prior Publication Data

US 2004/0041205 A1 Mar. 4, 2004

(51) Int. Cl.[7] .............................................. H01L 29/792
(52) U.S. Cl. ...................... 257/324; 257/288; 257/314; 257/326; 438/261; 438/424; 365/182
(58) Field of Search ................................ 257/288, 314, 257/324, 326; 365/182; 438/240, 241, 424, 258, 257, 261

(56) References Cited

U.S. PATENT DOCUMENTS

| | | | |
|---|---|---|---|
| 25,635 A | 2/1859 | Kwon et al. ................. 438/280 |
| 5,313,419 A | 5/1994 | Chang | |
| 5,702,988 A | * 12/1997 | Liang ......................... 438/238 |
| 5,717,634 A | 2/1998 | Smayling et al. | |
| 6,037,222 A | 3/2000 | Huang et al. | |
| 6,096,597 A | 8/2000 | Tsu et al. .................... 438/240 |
| 6,141,242 A | 10/2000 | Hsu et al. ................... 365/182 |
| 6,146,970 A | 11/2000 | Witek et al. ................. 438/424 |
| 6,180,456 B1 | 1/2001 | Lam et al. ................... 438/258 |
| 6,207,501 B1 | 3/2001 | Hsieh et al. ................. 438/258 |
| 6,228,712 B1 | 5/2001 | Kawai et al. ................ 438/257 |
| 6,258,667 B1 | 7/2001 | Huang | |
| 6,284,602 B1 | * 9/2001 | He et al. ..................... 438/258 |
| 6,368,907 B1 | * 4/2002 | Doi et al. .................... 438/217 |
| 6,406,960 B1 | 6/2002 | Hopper et al. .............. 438/261 |
| 2002/0041000 A1 | 4/2002 | Watanabe et al. | |

FOREIGN PATENT DOCUMENTS

| | | |
|---|---|---|
| EP | 0 810667 A2 | 12/1997 |
| EP | 0 997930 A1 | 5/2000 |
| JP | 02-260564 A | 10/1990 |

\* cited by examiner

Primary Examiner—Nathan J. Flynn
Assistant Examiner—Scott R. Wilson
(74) Attorney, Agent, or Firm—Thomas R. FitzGerald, Esq.; Laurence S. Roach, Esq.

(57) ABSTRACT

A process and product for making integrated circuits with dense logic and/or linear regions and dense memory regions is disclosed. On a common substrate, a dual hard mask process separately forms stacks of logic and/or linear transistors and EEPROM memory transistors. By using the process, the logic and/or linear and memory transistors are made with different sidewall insulating layers. The logic and/or linear transistors have relatively thin sidewall insulating layers sufficient to provide isolation from adjacent devices and conductors. The memory transistors have thicker sidewall insulating layer to prevent the charge stored in the memory device from adversely influencing the operation of the memory transistor.

7 Claims, 2 Drawing Sheets

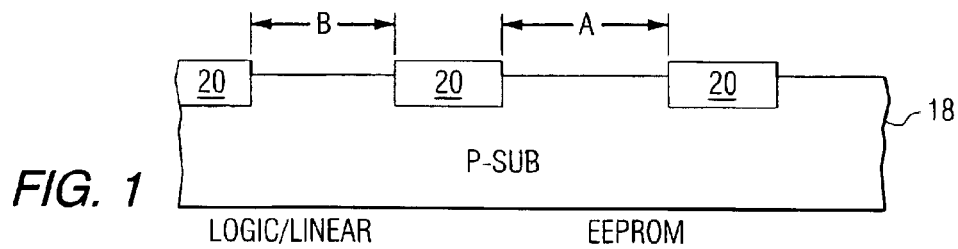
FIG. 1
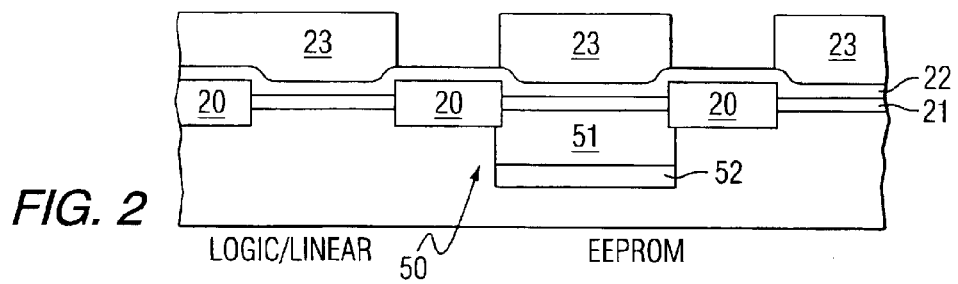
FIG. 2
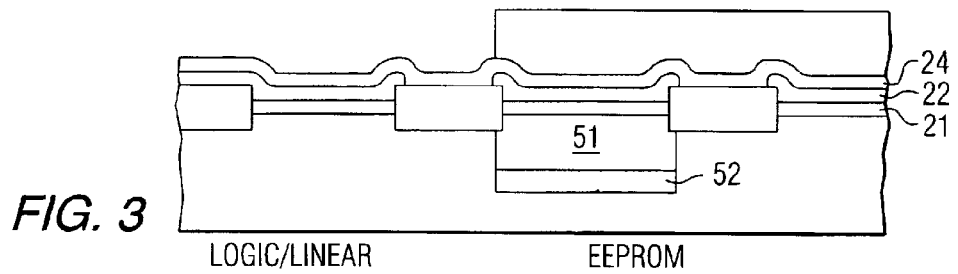
FIG. 3
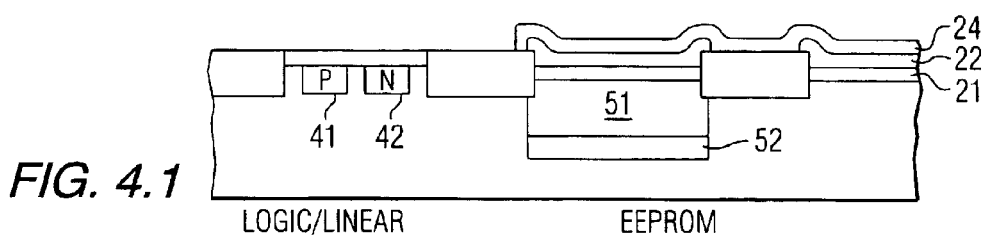
FIG. 4.1
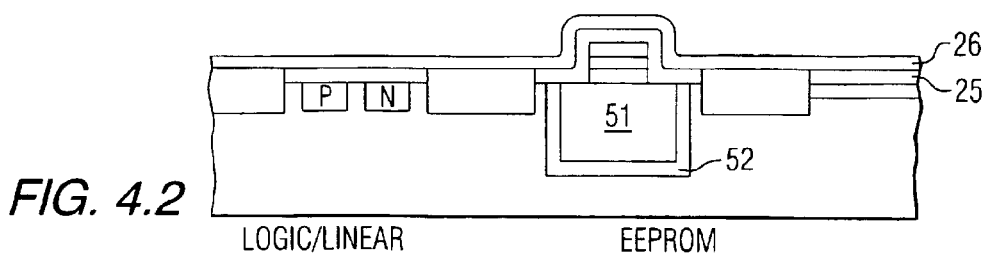
FIG. 4.2

LOGIC/LINEAR    EEPROM

LOGIC/LINEAR    EEPROM

LOGIC/LINEAR    EEPROM

LOGIC/LINEAR    EEPROM

FLASH MEMORY CELL AND THE METHOD OF MAKING SEPARATE SIDEWALL OXIDATION

BACKGROUND

Flash memory cells are often fabricated on the same substrate with logic or linear transistors. In order to have an efficient manufacturing process, the transistors for the control gate in the flash memory cells and the logic and linear transistors often share the same polysilicon mask. They also share the same sidewall oxidation process and the same reactive ion etch (RIE) of the gate. While the sharing of common steps is efficient, it also presents one or more technical problems. As features sizes shrink, logic and/or linear transistors require ultra shallow source and drain junction formation to avoid short channel effect (SCE). In order to achieve such ultra shallow source and drain junction formation the thermal budget for manufacturing the device must be kept very low. As such, sidewall oxidation process must be carried out at a low temperature or be entirely dispensed with. However, flash memory cell requires significant rounding of the gate edge to reduce the high electric fields that arise from the sharp gate edge, in order to retain charge in the gate stack. Gate rounding reduces leakage current by reducing the electric field around the charged trapped in the floating gate.

SUMMARY

The invention overcomes the problems of the prior art by optimizing sidewall oxidation processes and temperature for logic and linear transistors and for the flash memory transistor by using a dual hard mask (HM) approach. The logic and linear transistors are formed with one hard mask and the flash memory transistors are formed with another hard mask. A typical hard mask is formed from a chemical vapor deposited (CVD) TEOS (tetraethyl orthosilicade) oxide. While the additional TEOS hard mask adds several steps to the overall process, it avoids the expense of using an additional deep ultraviolet (DUV) mask to separate polysilicon for the control gate of the flash memory cells and the logic and linear transistors. The latter appears to be the only alternative for improving the existing, prior art process. More specifically, a second TEOS hard mask is added after the flash memory cell is etched. This occurs after removal of the first TEOS hard mask and formation of the flash sidewall oxide.

In order to practice the invention, the substrate is divided into a region including electrically erasable programmable memory EEPROM cells and other regions that include linear or logic devices. A triple well is formed in the EEPROM region. Then the gate stack is formed for the EEPROM transistor. This step includes forming a tunnel dielectric layer, a tunnel polysilicon gate layer, an interpoly dielectric layer and a control gate layer. The substrate is covered with a first hard mask, typically a TEOS layer. The TEOS layer is patterned and opened only in the EEPROM region to form source and drain regions for the EEPROM transistors. Those source and drain regions are implanted, the TEOS layer is removed, and the sidewalls are suitably oxidized for the EEPROM transistors. Thereafter, a second TEOS hard mask is deposited over the linear and logic regions. That TEOS hard mask is separately patterned to expose the source and drain regions for the linear and logic transistors. The linear and logic regions are implanted and the linear and logic transistors are completed in a manner well known in the art.

The invention allows the manufacturer to optimize the thickness of the sidewall insulating layer on the flash stack and the logic and/or linear stack. It enables manufacture of a device that has different sidewall dielectric thicknesses on the flash transistors and the logic and/or linear transistors. This structure overcomes the defects of prior art structures that have logic and/or linear and flash transistors with the same sidewall thickness. With the invention the logic and/or linear devices have thinner sidewall oxides and thus can be more closely spaced to provide added logic and/or linear circuitry on the substrate. In addition, the memory devices have thicker sidewall insulating layers that shield the charge stored in the interpoly dielectric layer from adversely influencing the operation of the memory transistor.

DESCRIPTION OF THE DRAWINGS

FIGS. 1–4.1 show initial key sequential steps in the process along the word line of the EEPROM region.

FIGS. 4.2–8 show final key sequential steps in the process along the bit line of the EEPROM region.

DETAILED DESCRIPTION

Figure 5:
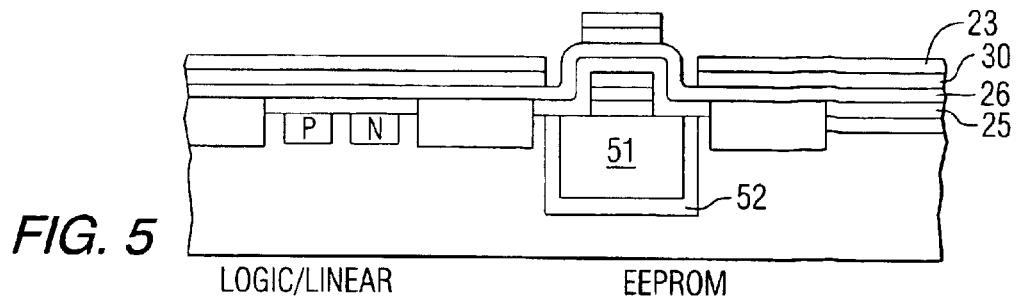
Figure 6:
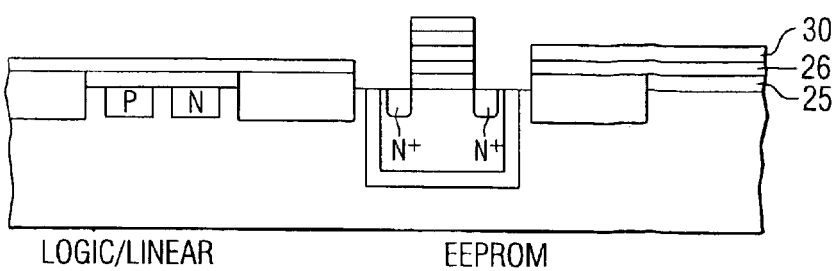
Figure 7:
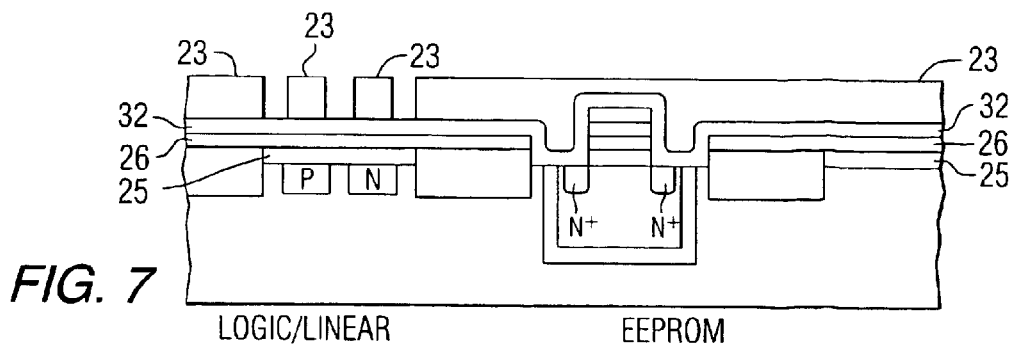
Figure 8:
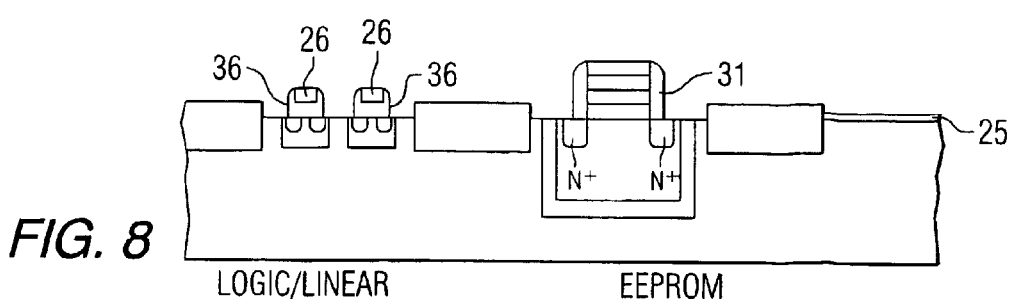

Turning to FIG. 1, a P-type substrate 18 is suitably patterned to form shallow trench isolation regions 20. The trench isolation regions 20 surround each EEPROM transistor and each pair of CMOS transistors. Those skilled in the art understand that the invention may be made on an N-type substrate where the dopings are suitable reversed. As shown in FIG. 2, the substrate is then covered with a floating gate oxide 21 followed by a layer 22 of polysilicon. Prior to deposition of the layers, a suitable portion of the substrate, such as portion A, is separately patterned and implanted to have a triple-well 50 comprising N-well 51 enclosed in a P-well 52 that resides in the P-type substrate 18. The drawing accompanying this description shows a logic CMOS pair of transistors in region B. Those regions may include transistor other than CMOS logic pairs. Those skilled in the art understand that transistor of one conductivity type may be formed in the B regions and types of transistors may be logic or linear, including and not limited to power transistors such as LDMOS transistors.

The oxide and polysilicon layers are then patterned with photoresist 23 to form a floating gate stack. Turning to FIG. 3, a layer 24 of oxinitride interpoly dielectric is deposited over the substrate. The layer 24 comprises sequentially deposited layers of low temperature deposited polysilicon that is oxidized and a layer of nitride rich silicon nitride. The layer 24 is suitably patterned by photoresist 23 to form two of the three layers of the ONO dielectric in the EEPROM stack as shown in FIG. 4. At this point, the layer 24 and polysilicon layer 11 are stripped from the peripheral regions B and they are suitably patterned and implanted to form P-wells 41 and N-wells 42.

Next, the substrate 18 is covered with a layer 25 of oxide followed by a second layer of polysilicon 26. The layer 25 forms the gate oxide layer for the logic and linear devices and forms the upper oxide layer of the ONO dielectric layer 24. The polysilicon layer 26 is provided for the control gates of the EEPROM transistors and the logic and linear transistors.

A first TEOS layer 30 is deposited over the second polysilicon layer 26. The first TEOS layer 30 is then suitably patterned with photoresist 23 to open the source and drain regions of the EEPROM. Source and drain regions are suitably implanted to form the source and drains of the EEPROM. After that, the first TEOS layer 30 is removed by a high selective reactive ion etching, stopping on polysilicon layer 26. Then the sidewalls of the gate stack of the EEPROM are oxidized to provide a sidewall oxide suitable for flash stack transistors. Oxidation takes place at about 850–950° centigrade in a furnace for approximately 30 minutes in order to grow a sidewall that is about 15 nanometers thick on the polysilicon regions of the gate stack. Thereafter, a second TEOS layer 32 is deposited over the substrate 18. TEOS layer 32 is suitably patterned with a photoresist layer 23 to form the gates and to open the source and drains of the logic and linear transistors.

The sources and drains of the logic and/or linear transistors are implanted, the second TEOS layer 32 is removed by reactive ion etching and the gates of the peripheral transistors receive a thinner sidewall oxide. That sidewall oxide is approximately 6 nanometers and is generated by a relatively short rapid thermal annealing step. The rapid thermal annealing is carried out at about 700–900° C. for about 10–20 second. It activates the doping in the logic and/or linear transistors but does not drive them very far into the substrate. This results in a logic and/or linear region with relatively closely spaced transistors.

As a result of the process described above a manufacturer may produce a single integrated circuit with logic and/or linear and memory devices having different sidewall insulating thicknesses. In the logic and/or linear region the sidewalls can be optimized to be as thin as needed to provide more transistor in the region allowed for logic and/or linear devices. In the memory region the memory devices are optimized to have a thick enough sidewall oxide to prevent the charge stored in the interpoly dielectric layer from having an unwanted effect on the operation of the memory transistors.

I claim:

1. An integrated circuit with logic and/or linear transistors and memory devices comprising:

a region of logic and/or linear devices comprising field effect transistors, each including a source spaced from a drain, a channel between the source and drain, a control gate including an insulating layer over the channel an a gate electrode on the insulating layer for controlling the electric field in the channel, and a logic and/or linear device sidewall insulating layer on the sides of the gate electrode to separate it from adjacent transistors;

a region of memory devices including electrically programmable memory transistors each comprising a source spaced from a drain, a channel between the source and drain, a control gate including an insulating layer over the channel and a first electrode on the insulating layer for controlling the electric field in the channel, a dielectric layer over the control gate, a second electrode on the dielectric layer for applying a voltage to the transistor to store or remove a charge in the dielectric layer, and a memory device sidewall insulating layer on the sides of the first and second electrodes to reduce the electric field in the substrate generate by the charge stored in the dielectric layer over the control gate and to separate adjacent memory devices from each other, wherein the memory device sidewall insulating layer is thicker than the logic and/or linear device sidewall insulating layer.

2. The integrated circuit of claim 1 wherein the logic and/or linear insulating sidewall layer is less than half the thickness of the memory device sidewall insulating layer.

3. The integrated circuit of claim 2 wherein the logic and/or linear device sidewall insulating layer is about 6 nanometers thick and the memory device sidewall insulating layer is about 15 nanometers thick.

4. The integrated circuit of claim 1 wherein the memory devices are EEPROM transistors and are formed in triple well regions in the substrate.

5. The integrated circuit of claim 1 wherein the sidewall insulating layers are silicon dioxide.

6. The integrated circuit of claim 1 wherein the electrodes are doped polysilicon.

7. An integrated circuit with logic and/or linear transistors and memory devices comprising:

a region of logic and/or linear devices comprising field effect transistors, each including a source spaced from a drain, a channel between the source and drain, a control gate including an insulating layer over the channel and a gate electrode on the insulating layer for controlling the electric field in the channel, and a logic and/or linear device sidewall oxidation layer on the sides of the gate electrode to separate it from adjacent transistors;

a region of memory devices including electrically programmable memory transistors each comprising a source spaced from a drain, a channel between the source and drain, a control gate including an insulating layer over the channel and a first electrode on the insulating layer for controlling the electric field in the channel, a dielectric layer over the control gate, a second electrode on the dielectric layer for applying a voltage to the transistor to store or remove a charge in the dielectric layer, and a memory device sidewall oxidation layer on the sides of the first and second electrodes to reduce the electric field in the substrate generated by the charge stored in the dielectric layer over the control gate and to separate adjacent memory devices from each other, wherein the memory device sidewall oxidation layer is thicker than the logic and/or linear device sidewall oxidation layer.

* * * * *